United States Patent
Chou et al.

(10) Patent No.: US 10,964,590 B2
(45) Date of Patent: Mar. 30, 2021

(54) CONTACT METALLIZATION PROCESS

(71) Applicant: Taiwan Semiconductor Manufacturing Co., Ltd., Hsinchu (TW)

(72) Inventors: Tien-Pei Chou, Hsinchu (TW); Ken-Yu Chang, Hsinchu (TW); Sheng-Hsuan Lin, Hsinchu County (TW); Yueh-Ching Pai, Taichung (TW); Yu-Ting Lin, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 85 days.

(21) Appl. No.: 15/967,056

(22) Filed: Apr. 30, 2018

(65) Prior Publication Data
US 2019/0148223 A1 May 16, 2019

Related U.S. Application Data

(60) Provisional application No. 62/586,330, filed on Nov. 15, 2017.

(51) Int. Cl.
*H01L 21/768* (2006.01)
*H01L 21/285* (2006.01)
(Continued)

(52) U.S. Cl.
CPC .. *H01L 21/76843* (2013.01); *H01L 21/28568* (2013.01); *H01L 21/76802* (2013.01); *H01L 21/76876* (2013.01)

(58) Field of Classification Search
CPC ............ H01L 21/28; H01L 21/28017; H01L 28/28026; H01L 21/28052; H01L 28/28061; H01L 28/28079; H01L 28/28088; H01L 28/28097; H01L 28/28114; H01L 28/28568; H01L 21/76802; H01L 21/76804;
(Continued)

(56) References Cited

U.S. PATENT DOCUMENTS 3,461,054 A * 8/1969 Vratny .................. C23C 14/345
204/192.15
3,617,459 A * 11/1971 Logan .................. C23C 14/345
204/192.23
(Continued)

FOREIGN PATENT DOCUMENTS

JP 2004-153162 * 5/2004 ........... H01L 21/768

*Primary Examiner* — Maliheh Malek
(74) *Attorney, Agent, or Firm* — Sterne, Kessler, Goldstein & Fox P.L.L.C.

(57) ABSTRACT

The present disclosure describes a method to a metallization process with improved gap fill properties. The method includes forming a contact opening in an oxide, forming a barrier layer in the contact opening, forming a liner layer on the barrier layer, and forming a first metal layer on the liner layer to partially fill the contact opening. The method further includes forming a second metal layer on the first metal layer to fill the contact opening, where forming the second metal layer includes sputter depositing the second metal layer with a first radio frequency (RF) power and a direct current power, as well as reflowing the second metal layer with a second RF power.

20 Claims, 10 Drawing Sheets

(51) Int. Cl.
*H01L 23/52* (2006.01)
*H01L 29/40* (2006.01)

(58) Field of Classification Search
CPC ......... H01L 21/76805; H01L 21/76843; H01L 21/76876; H01L 27/10888; H01L 29/40; H01L 29/4941; H01L 29/495; H01L 29/4958; H01L 29/4966; H01L 29/4957; H01L 21/76882
See application file for complete search history.

(56) References Cited

U.S. PATENT DOCUMENTS

| | | | | |
|---|---|---|---|---|
| 3,669,863 | A * | 6/1972 | Peters | G03F 1/54 204/192.15 |
| 3,755,123 | A * | 8/1973 | Davidse | C23C 14/35 204/192.15 |
| 4,039,416 | A * | 8/1977 | White | C23C 14/32 427/523 |
| 4,874,494 | A * | 10/1989 | Ohmi | C23C 14/34 204/192.12 |
| 5,423,971 | A * | 6/1995 | Arnold | H01J 37/32091 118/718 |
| 5,507,930 | A * | 4/1996 | Yamashita | C23C 14/0605 204/192.15 |
| 5,525,199 | A * | 6/1996 | Scobey | C23C 14/0047 204/192.12 |
| 5,534,463 | A * | 7/1996 | Lee | H01L 21/3105 438/643 |
| 5,693,197 | A * | 12/1997 | Lal | C23C 14/352 204/192.15 |
| 5,849,163 | A * | 12/1998 | Ichikawa | C23C 14/14 204/192.23 |
| 6,045,666 | A * | 4/2000 | Satitpunwaycha | C23C 14/0036 204/192.12 |
| 6,140,228 | A * | 10/2000 | Shan | H01L 21/2855 204/192.17 |
| 6,197,686 | B1 * | 3/2001 | Taguchi | H01L 21/76843 257/E21.584 |
| 6,248,220 | B1 * | 6/2001 | Seon | C23C 14/34 204/192.12 |
| 6,280,585 | B1 * | 8/2001 | Obinata | C23C 14/046 204/298.06 |
| 6,306,761 | B1 * | 10/2001 | Taguchi | H01L 21/76843 438/646 |
| 6,376,355 | B1 * | 4/2002 | Yoon | H01L 21/76843 438/618 |
| 6,391,769 | B1 * | 5/2002 | Lee | H01L 21/28562 257/750 |
| 7,244,344 | B2 * | 7/2007 | Brown | C23C 14/046 204/298.11 |
| 7,399,943 | B2 * | 7/2008 | Brown | C23C 14/046 118/723 I |
| 7,445,996 | B2 * | 11/2008 | McDaniel | H01L 21/76816 257/E21.585 |
| 7,504,006 | B2 * | 3/2009 | Gopalraja | C23C 14/345 204/192.12 |
| 7,605,033 | B2 * | 10/2009 | McDaniel | H01L 21/02068 438/210 |
| 7,682,966 | B1 * | 3/2010 | Rozbicki | H01L 21/76843 438/637 |
| 8,668,816 | B2 * | 3/2014 | Ding | H01L 21/76814 204/298.25 |
| 9,105,490 | B2 | 8/2015 | Wang et al. | |
| 9,123,508 | B2 * | 9/2015 | Chistyakov | H01J 37/3408 |
| 9,230,795 | B1 * | 1/2016 | Wang | H01L 21/26586 |
| 9,236,267 | B2 | 1/2016 | De et al. | |
| 9,236,300 | B2 | 1/2016 | Liaw | |
| 9,406,804 | B2 | 8/2016 | Huang et al. | |
| 9,443,769 | B2 | 9/2016 | Wang et al. | |
| 9,520,482 | B1 | 12/2016 | Chang et al. | |
| 9,548,366 | B1 | 1/2017 | Ho et al. | |
| 9,576,814 | B2 | 2/2017 | Wu et al. | |
| 9,620,627 | B1 * | 4/2017 | Yeo | H01L 27/1203 |
| 9,831,183 | B2 | 11/2017 | Lin et al. | |
| 9,859,386 | B2 | 1/2018 | Ho et al. | |
| 10,510,851 | B2 * | 12/2019 | Wang | H01L 21/3221 |
| 10,535,748 | B2 * | 1/2020 | Cheng | H01L 21/02063 |
| 10,685,842 | B2 * | 6/2020 | Chang | H01L 21/28061 |
| 10,825,737 | B2 * | 11/2020 | Lee | H01L 21/28518 |
| 2001/0038886 | A1 * | 11/2001 | Taguchi | H01L 21/76843 427/194 |
| 2002/0014402 | A1 * | 2/2002 | Nagamine | C23C 14/34 204/192.13 |
| 2002/0100924 | A1 * | 8/2002 | Rhodes | H01L 21/76886 257/256 |
| 2003/0022437 | A1 * | 1/2003 | Fishburn | H01L 27/10811 438/245 |
| 2003/0087499 | A1 * | 5/2003 | Lane | H01L 21/76877 438/396 |
| 2003/0107074 | A1 * | 6/2003 | Chen | H01L 21/02074 257/306 |
| 2003/0116427 | A1 * | 6/2003 | Ding | H01L 21/76864 204/192.17 |
| 2004/0102027 | A1 * | 5/2004 | Liao | H01L 21/76816 438/586 |
| 2005/0006222 | A1 * | 1/2005 | Ding | C23C 14/3457 204/192.1 |
| 2006/0046398 | A1 * | 3/2006 | McDaniel | H01L 21/02068 438/279 |
| 2006/0289918 | A1 * | 12/2006 | McDaniel | H01L 21/02068 257/296 |
| 2007/0187678 | A1 * | 8/2007 | Hirao | H01L 21/02491 257/43 |
| 2007/0243708 | A1 * | 10/2007 | Hahn | C23C 14/046 438/688 |
| 2009/0263966 | A1 * | 10/2009 | Weichart | C23C 14/046 438/656 |
| 2009/0321247 | A1 * | 12/2009 | Cerio, Jr. | C23C 14/025 204/192.11 |
| 2011/0097897 | A1 * | 4/2011 | Tanaka | H01L 21/2855 438/653 |
| 2011/0133651 | A1 * | 6/2011 | Chistyakov | H01J 37/3444 315/111.41 |
| 2012/0018848 | A1 * | 1/2012 | Huang | H01L 21/2236 257/616 |
| 2012/0108058 | A1 * | 5/2012 | Ha | H01L 21/76843 438/653 |
| 2012/0302058 | A1 * | 11/2012 | Tanaka | C23C 14/046 438/653 |
| 2013/0029493 | A1 * | 1/2013 | Ogasawara | H01L 21/31144 438/723 |
| 2013/0256638 | A1 * | 10/2013 | Uesugi | H01L 51/5228 257/40 |
| 2014/0305802 | A1 * | 10/2014 | Ding | C23C 14/564 205/123 |
| 2015/0235956 | A1 * | 8/2015 | Lin | H01L 23/53266 257/757 |
| 2015/0255396 | A1 * | 9/2015 | Lin | H01L 21/76897 257/754 |
| 2015/0311150 | A1 * | 10/2015 | Lin | H01L 23/53238 257/751 |
| 2015/0318243 | A1 * | 11/2015 | Lin | H01L 21/28518 257/751 |
| 2016/0043035 | A1 * | 2/2016 | Lin | H01L 21/76802 257/751 |
| 2016/0254186 | A1 * | 9/2016 | Leib | H01L 29/41791 257/383 |
| 2016/0276267 | A1 * | 9/2016 | Lee | H01L 21/76873 |
| 2018/0151429 | A1 * | 5/2018 | Wang | H01L 21/28518 |
| 2018/0151679 | A1 * | 5/2018 | Wang | H01L 21/76855 |
| 2018/0308751 | A1 * | 10/2018 | Wang | H01L 21/76829 |
| 2019/0148223 | A1 * | 5/2019 | Chou | H01L 21/76843 |
| 2019/0148556 | A1 * | 5/2019 | Wang | H01L 21/82343 257/365 |
| 2019/0164822 | A1 * | 5/2019 | Chou | H01L 29/41791 |
| 2019/0164825 | A1 * | 5/2019 | Yang | H01L 21/2855 |
| 2019/0164827 | A1 * | 5/2019 | Yang | H01L 21/2855 |

(56) References Cited

U.S. PATENT DOCUMENTS

| | | | | |
|---|---|---|---|---|
| 2019/0273042 A1* | 9/2019 | Cheng | ................ | H01L 23/5226 |
| 2019/0273147 A1* | 9/2019 | Cheng | ................ | H01L 29/7851 |
| 2019/0355585 A1* | 11/2019 | Chang | .............. | H01L 29/66795 |
| 2020/0152763 A1* | 5/2020 | Cheng | .............. | H01L 21/76802 |
| 2020/0343087 A1* | 10/2020 | Lin | .................. | H01L 21/76876 |

* cited by examiner

CONTACT METALLIZATION PROCESS

CROSS-REFERENCE TO RELATED APPLICATION

This application claims the benefit of U.S. Provisional Patent Application No. 62/586,330, titled "Contact Metallization Process," which was filed on Nov. 15, 2017 and is incorporated herein by reference in its entirety.

BACKGROUND

Contact openings are progressively becoming more challenging to fill in integrated circuit (IC) fabrication due to their demanding geometry. Consequently, a metal deposition may be unable to fill a contact opening without the formation of voids or seams. Voids in contacts are undesirable because they may increase the contact's resistance and adversely affect the IC's reliability.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
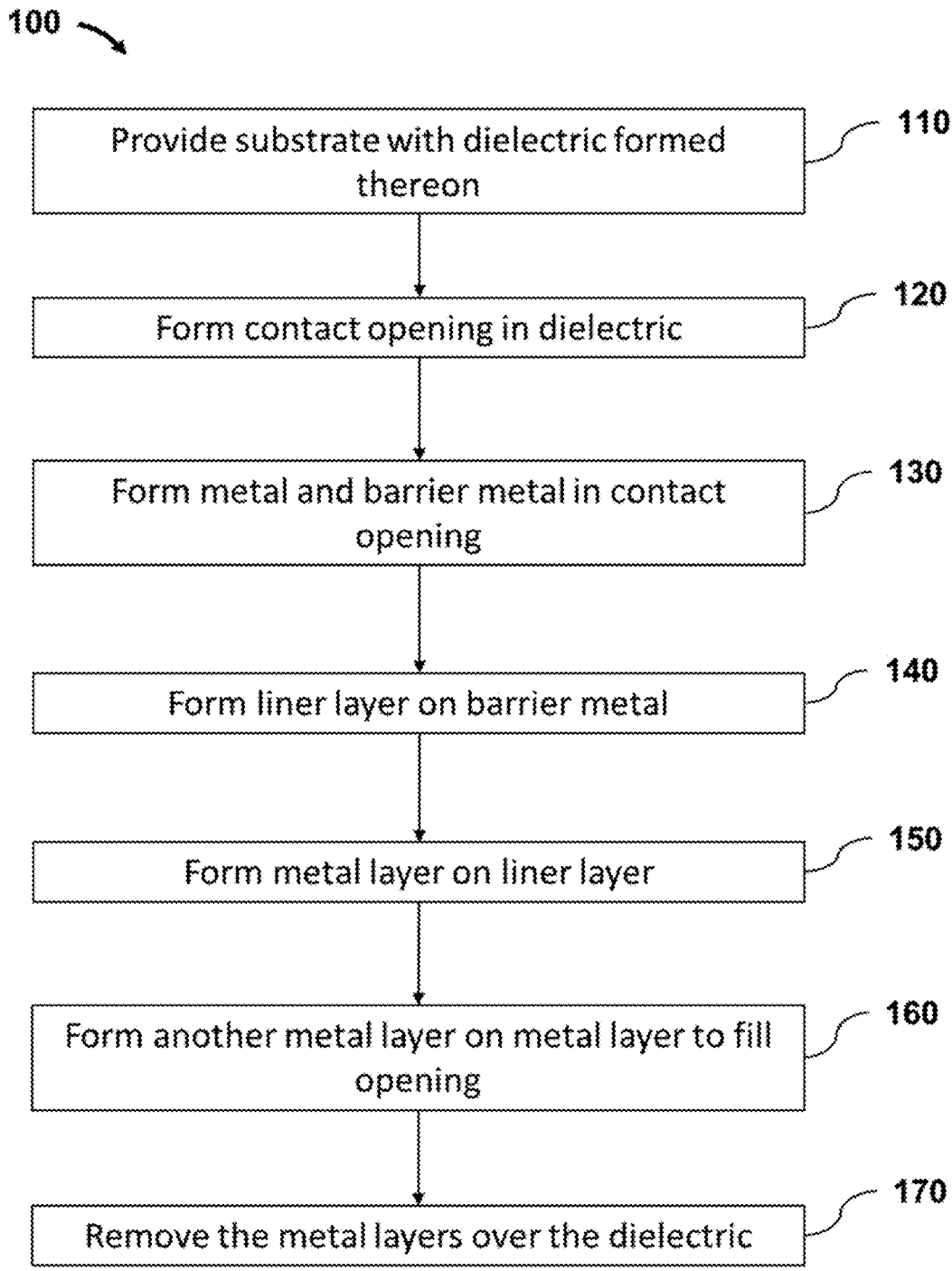
FIG. 1 is a flow diagram of an example contact metallization method with a co-deposition/reflow operation, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of a device in use or operation in addition to the orientation depicted in the figures. The device may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "vertical," as used herein, means nominally perpendicular to the surface of a substrate.

In chip fabrication, lower-level interconnects also referred to as "metal contacts"—are formed to electrically connect terminals of one or more field effect transistors (FETs)—e.g., gate, source, and/or drain terminals to higher-level interconnects. Metal contacts can be formed via etching an interlayer dielectric stack to form one or more contact openings on the transistor's gate and on epitaxial layers of the source/drain regions. Filling the contact openings with a metal completes the metal contact formation. Metal contact formation is also referred to herein as "contact metallization."

Contact openings are progressively becoming more challenging to fill due to their demanding geometry. For example, a contact opening may have an aspect ratio (AR)—e.g., ratio that can be defined by the opening's height to the opening's width—between about 3 and about 10 (e.g., 6) with a top portion of the opening having a critical dimension (CD) smaller than about 17 nm and a bottom portion of the opening having a CD smaller than about 14 nm. At the same time, the height of the contact can be greater than about 60 nm. Consequently, a metal deposition may be unable to fill the contact opening without the formation of voids or seams. Voids in contacts are undesirable because they may increase the contact's resistance and adversely affect a chip's reliability. For example, voids—depending on their size and position in the contact—can be exposed during a subsequent chemical mechanical planarization (CMP) process. With the voids exposed, slurry from the CMP process can enter the voids and remove metal from the contacts.

Pinch-off is a failure mechanism during a metal fill process that can lead to void formation in a contact. Pinch-off can be initiated when the metal deposition rate is high and metal deposits do not have sufficient time to reach the bottom of the contact. As a result, metal deposits accumulate on a top opening of the contact and prevent incoming metal deposits from reaching the bottom of the contact. Another reason for pinch-off formation during the metal fill process can be related to the contact profile. For example, a contact profile that has a re-entrant top opening, where the top CD of the opening is smaller than its a middle or bottom CD. In this case, pinch-off can be triggered when the metal deposition rate is sufficiently low.

The embodiments described herein are directed to a method that describes a cobalt (Co) metallization process with improved gap fill. The embodiments can be used to metal fill contacts with, for example, an AR between about 3 to about 10 and a height greater than about 60 nm. By way of example and not limitation, this disclosure includes a co-deposition/reflow physical vapor deposition (PVD) process that utilizes a radio frequency (RF) power to independently control the deposition and reflow process of the deposited metal.

FIG. 1 is a flow diagram of an example metal deposition method 100 according to some embodiments. Metal deposition method 100 describes the formation of Co metal in contacts. The contacts can have an AR between, for example, about 3 to about 10 and a depth greater than about 60 nm. Other fabrication operations may be performed between the various operations of metal deposition method 100 and are not discussed herein merely for clarity. Metal deposition method 100 is not limited to the operations shown in FIG. 1 and other alternative methods can be possible. Furthermore, the figures provided to describe method 100 are for illustrative purposes only and are not to scale. Some structures, films, or geometries may have been deliberately augmented for illustrative purposes.

Figure 2:
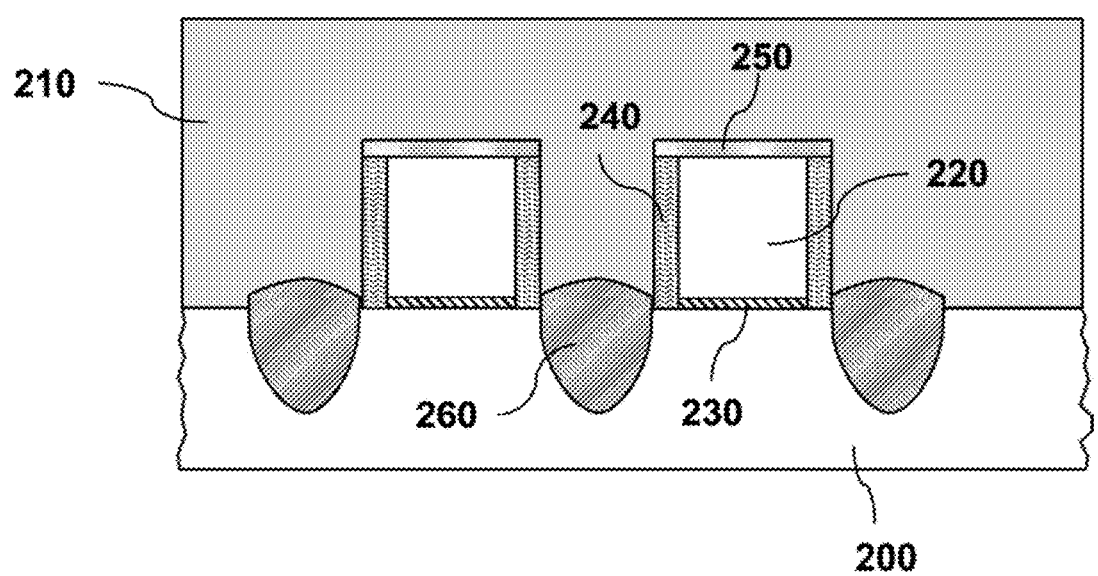
FIG. 2 is a cross sectional view of two example neighboring gate structures with respective epitaxial layers embedded in a dielectric over a substrate, in accordance with some embodiments.

Method 100 begins with operation 110, where a substrate 200 is provided with a dielectric 210 formed thereon as shown in FIG. 2. In some embodiments, substrate 200 may also refer to a fin structure on a wafer. For example, substrate 200 can be a portion of a semiconductor fin on a wafer. In some embodiments, the fin and the wafer can be made of the same or different material. Further, substrate 200 can be a fin on a bulk semiconductor wafer or a fin on a silicon on insulator (SOI) wafer. Further, substrate 200 can be made of silicon or another elementary semiconductor such as, for example, (i) germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof.

For example purposes, substrate 200 in method 100 will be described in the context of a silicon fin on a silicon wafer (e.g., single crystal). Based on the disclosure herein, other materials can be used, which are within the spirit and scope of this disclosure.

FIG. 2 includes additional elements such as gate electrodes 220, high-k dielectrics 230, spacers 240, capping layers 250, and S/D epitaxial layers 260. In some embodiments, gate electrodes 220, high-k dielectrics 230, spacers 240, and capping layer 250 form a gate structure of a FET. Further, a gate structure along with adjacent S/D epitaxial layers can form terminals of the FET. In some embodiments, fewer or additional gate structures and S/D epitaxial layers 260 can be formed on substrate 200. Therefore, the number of gate structures or S/D epitaxial layers 260 depicted in FIG. 2 is not limiting. In some embodiments, S/D epitaxial layers 260 can be a p-type epitaxially grown SiGe stack or an n-type carbon-doped epitaxial silicon (Si:C) stack. In some embodiments, dielectric 210 can be an interlayer dielectric (ILD) made of silicon dioxide ($SiO_2$), carbon-doped silicon oxide ($SiO_xC$), silicon oxy-nitride (SiON), silicon-oxy-carbon nitride (SiOCN), silicon carbide (SiC), silicon carbon nitride (SiCN), or a combination thereof. In some embodiments, dielectric 210 can be a stack of two or more dielectric materials. Dielectric 210 can provide electrical isolation between gate electrodes 220 and the metal contacts that will be formed adjacent to gate electrodes 220. Dielectric 210 can be deposited with a CVD process, a flowable CVD process, a PVD process, or a thermally-grown process.

According to some embodiments, high-k dielectric 230 can be deposited by atomic layer deposition (ALD) and its thickness can range from about 10 Å to about 20 Å. In some embodiments, high-k dielectric 230 can be hafnium oxide ($HfO_2$), a hafnium silicate-based material, or another dielectric material with dielectric constant (k-value) greater than 3.9—which is the dielectric constant of $SiO_2$ and is used as an example reference.

Gate electrode 220 can be a multilayer metal stack which can include: (i) a capping layer for high-k dielectric 230, (ii) one or more metallic layers, (iii) a work function metal (WFM) stack, and (iv) a metal fill layer. For simplicity, the capping layer, the one or more metallic layers, the WFM stack, and the metal fill layer are not individually depicted within gate electrode 220 of FIG. 2. In some embodiments, the capping layer for high-k dielectric 230 can be deposited with an ALD process. ALD is a deposition method that can provide controlled and conformal layer growth at, for example, an angstrom level. In some embodiments, the capping layer for high-k dielectric 230 can have a thickness that ranges from about 5 Å to about 15 Å. The capping layer for high-k dielectric 230 can be used to protect high-k dielectric 230 from subsequent processing operations—e.g., the formation of the one or more metallic layers of gate electrode 220. In some embodiments, the capping layer for high-k dielectric 230 can be a titanium (Ti)-based material.

The number and type of metallic layers in gate electrode 220 may depend on the transistor's threshold voltage requirements. Exemplary metallic layers in gate electrode 220 may include a tantalum nitride (TaN) bottom layer and one or more titanium nitride (TiN) layers. In some embodiments, the TaN bottom layer can be deposited by CVD. By way of example and not limitation, the thickness of the TaN bottom layer can range from about 10 Å to about 15 Å. In some embodiments, the one or more TiN layers can be formed by an ALD or a diffusion process. The TiN layers deposited with the ALD process can have a thickness between, for example, about 8 Å and about 12 Å, while the TiN layers deposited with a diffusion process can be thicker, e.g., with a thickness ranging from about 12 Å to about 50 Å.

In some embodiments, the WFM stack can include titanium/aluminum (Ti/Al) bi-layers or a Ti—Al alloy, both of which can be deposited with an ALD process. By way of example and not limitation, the WFM stack can have a thickness range between about 20 Å and about 35 Å. The WFM stack can tune the work function of the metal gate electrode and influence the threshold voltage of the transistor. The thickness and the number of the one or more TiN layers, in combination with the WFM stack, can set the transistor's threshold voltage.

In some embodiments, a metal fill layer can include a TIN barrier layer and a tungsten (W) metal stack. The TiN barrier layer, which can be deposited with an ALD process, can protect the underlying WFM stack from a fluorine chemistry used during the deposition of the W metal stack. According to some embodiments, the thickness of the TiN barrier layer can be between about 40 Å and about 50 Å.

In some embodiments, capping layer 250 can be a nitride etch stop layer formed to protect gate electrode 220 during a subsequent formation of contacts. In some embodiments, capping layer 250 can be silicon nitride ($Si_xN_y$).

In some embodiments, spacers 240 can be made of a dielectric material, such as $SiO_2$, silicon oxynitride (SiON), carbon-doped silicon nitride (SiCN), silicon oxycarbide ($SiO_xC_y$), or $Si_xN_y$. In some embodiments, the thickness of spacers 240 can range from about 2 nm to about 5 nm. Spacers 240 can be a stack of one or more layers made of the same or different materials. In some embodiments, spacers 240 can be used as alignment masks during the formation of a FET's S/D regions on top of which S/D epitaxial layers 260 are formed.

Figure 3:
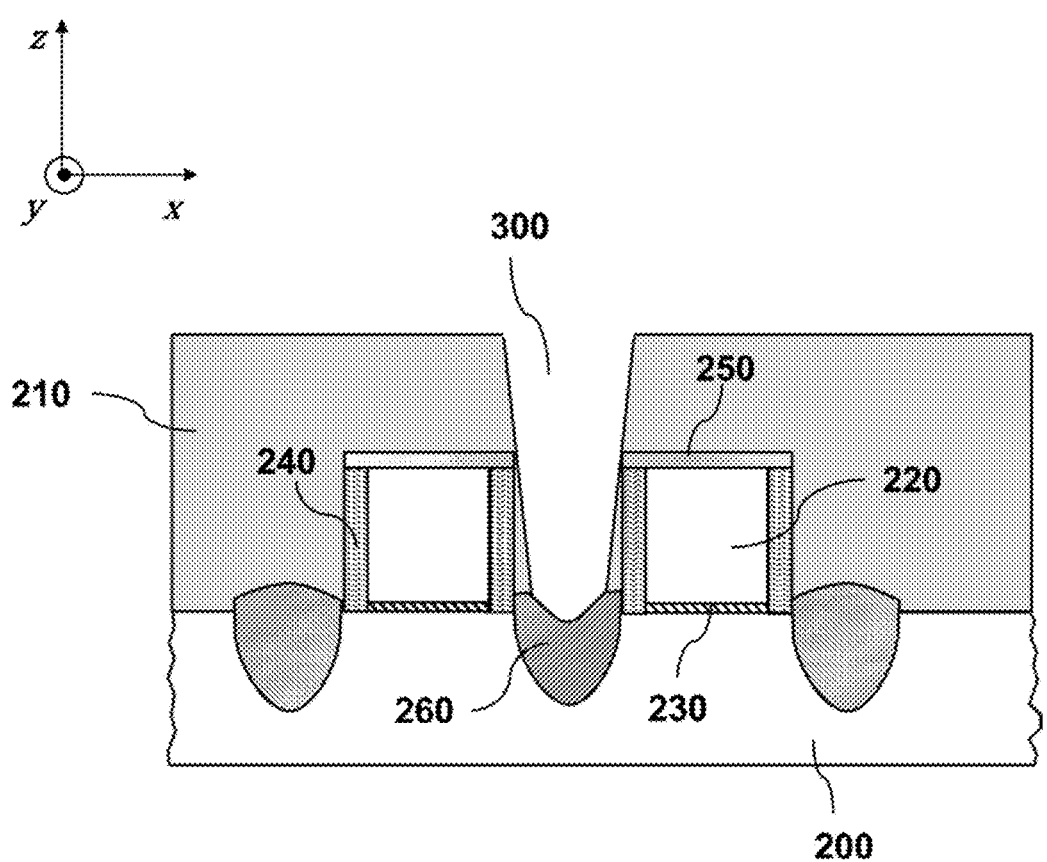
FIG. 3 is a cross sectional view of two example neighboring gate structures with respective epitaxial layers embedded in a dielectric after formation of a contact opening in a dielectric, in accordance with some embodiments.

Method 100 continues with operation 120 and the formation of a contact opening in dielectric 210. For example, FIG. 3 shows a contact opening 300 in dielectric 210. Contact opening 300 can be formed via patterning dielectric 210 using photolithography and etch processes. For instance, a coat of photoresist can be applied on dielectric 210. The photoresist can be developed according to a desired pattern; for example, a desired pattern could be openings in dielectric 210 to expose a portion of the S/D epitaxial layer 260. The undeveloped areas of the photoresist can be stripped with a wet or dry etch process to leave the desired pattern of developed photoresist on dielectric 210. A dry etch process can be used, for example, to remove exposed areas of dielectric 210 between the photoresist pattern. Areas of dielectric 210 covered by the developed photoresist can be protected from the etch chemistry of the dry etch process and therefore not etched. The etch process can be anisotropic so that the sidewalls of contact opening 300 can be substantially vertical (e.g., greater than 80°, such as 87°). By way of example and not limitation, a dry etch chemistry can include a mixture of carbon fluoride gases ($CF_x$). Capping layer 250 can protect gate electrode 220 during the etch process and while dielectric 210 is being etched. The etch process may also etch part of spacer 240. However, the etching selectivity towards dielectric 210 can be much higher (e.g., greater than 5:1) and therefore dielectric 210 will be etched faster than, for example, spacer 240. The etch process may be end-pointed when S/D epitaxial layer 260 is exposed.

During the formation of contact opening 300, the top surface of S/D epitaxial layer 260 may be partially etched according to some embodiments. In some embodiments, and while the top surface of the S/D epitaxial layer 260 is being etched, S/D material (e.g., SiGe) can be sputtered from the top surface of S/D region and get "re-deposited" to the sidewall surfaces at the bottom of contact opening 300. The re-deposited SiGe layer is not shown in FIG. 3 for simplicity.

In some embodiments, contact opening 300 can be a "shared" opening between gate electrode 220 and one of the S/D epitaxial layers 260. By way of example and not limitation, in the 3-dimensional space, contact opening 300 can be considered a trench in dielectric 210 along the y-axis. In some embodiments, a plurality of contact openings similar to contact opening 300 may be formed in dielectric 210 in other locations of dielectric 210. In some embodiments, contact openings similar to opening 300 can be formed on gate electrodes 220. According to some embodiments, contact opening 300 may have, for example, an AR between about 3 and about 10, a top CD below about 17 nm, a bottom CD below about 14 nm, and a height of about 60 nm.

In some embodiments, prior to any metal deposition, opening 300 is treated with a pre-clean process to remove any native oxide that may have formed on the top surface of S/D epitaxial layer 260. A native oxide can be formed, for example, via exposure of a wafer to air between processes or as a "byproduct" during the formation of contact opening 300. A native oxide can increase the metal contact resistance if not removed.

By way of example and not limitation, the pre-clean process can be a combination of a physical etch and a chemical etch. For example, the physical etch may include argon (Ar) sputtering. Ar sputtering can remove, for example, between about 30 Å to about 60 Å of native oxide from the top surface of S/D epitaxial layer 260. However, due to the AR of contact opening 300 (e.g., between about 3 to about 10), Ar sputtering may not be sufficient to remove a native oxide from the bottom of contact opening 300. The chemical etch may complement the Ar sputtering etch. By way of example and not limitation, the chemical etch may use a remote plasma from a mixture of ammonia (NH3), nitrogen trifluotide (NF3), and hydrogen (H2) gases. The plasma reacts with silicon containing oxides, such as the native oxide on StD epitaxial layer 260, to form a salt that can be sublimated at a temperature, for example, between about 100° C. to about 200° C.

Figure 4:
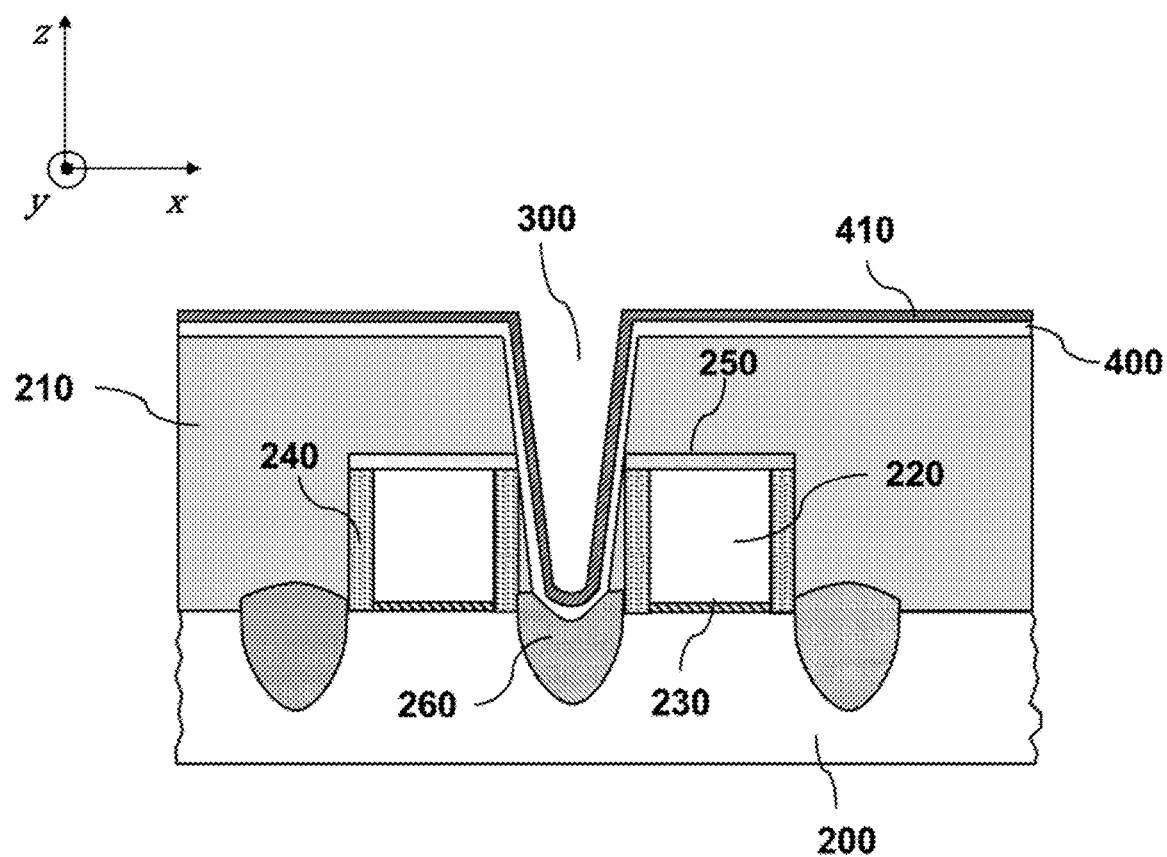
FIG. 4 is a cross sectional view of an example contact opening in a dielectric after deposition of a metal and barrier layer in the contact opening, in accordance with some embodiments.

Method 100 continues with operation 130. In 130, once the top surface of S/D epitaxial layer 260 has been cleaned, a subsequent in-situ metal deposition forms a metal 400 and a barrier layer 410 in contact opening 300 as shown in FIG. 4. According to some embodiments, metal 400 can be titanium (Ti). By way of example and not limitation, Ti can be deposited via a PVD process that uses a radio frequency source (RF PVD). RF PVD can improve Ti bottom coverage and mitigate Ti overhang, or pinch-off, at the top corners of contact opening 300. According to some embodiments, Ti may be deposited thicker at the bottom of contact opening 300 compared to the sidewalls of contact opening 300. In some embodiments, the Ti thickness can range from about 100 Å to about 130 Å. In some embodiments, barrier layer 410 can be titanium nitride (TiN) deposited conformally with an ALD process at a deposition temperature between about 300° C. and 350° C. By way of example and not limitation, the thickness of TiN can range from about 15 Å to about 20 Å. TiN can prevent oxidation of the underlying Ti metal 400 and provide an adhesion surface for a Co layer. According to some embodiments, barrier layer 410 may not be limited to TiN and may include other materials such as tantalum nitride (TaN), indium oxide ($In_2O_3$), tungsten nitride (WN), tantalum (Ta), niobium (Nb), zirconium (Zr), vanadium (V), tungsten (W), and ruthenium (Ru).

Figure 5:
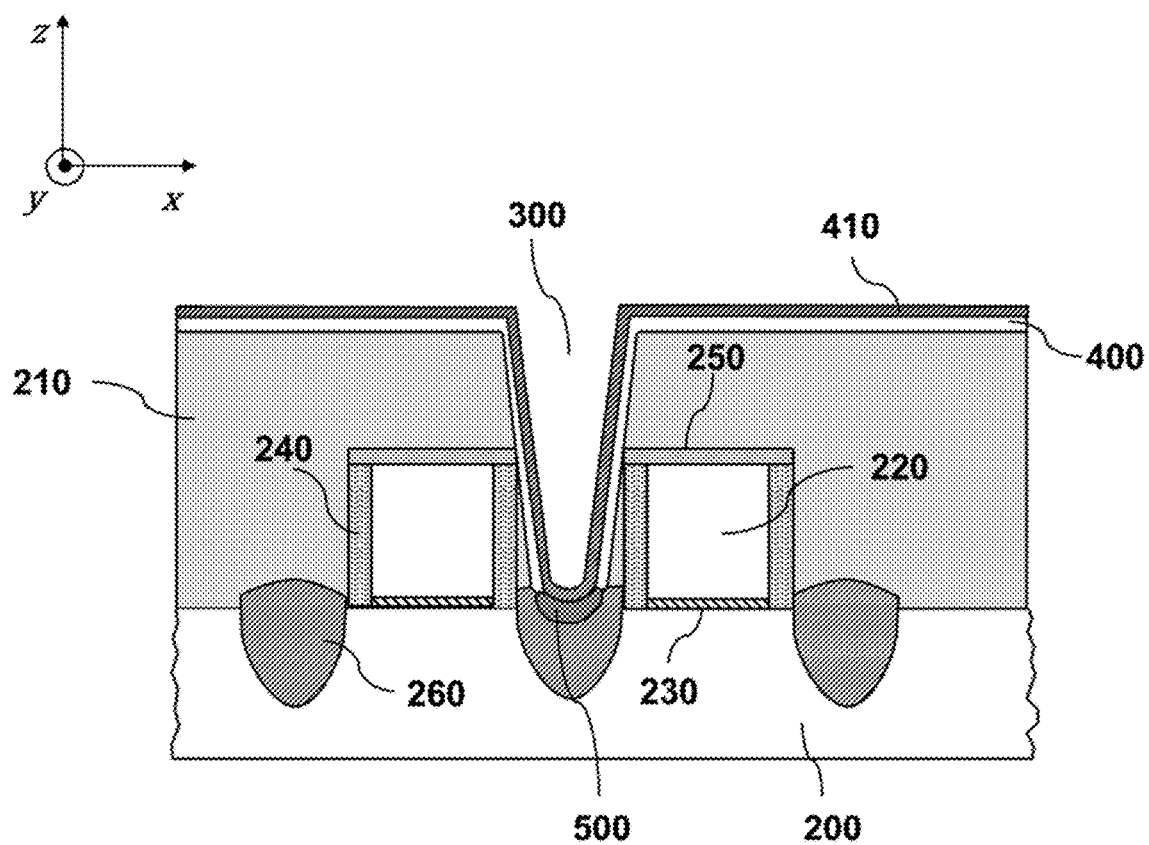
FIG. 5 is a cross sectional view of an example contact opening in a dielectric after formation of a silicide at a bottom of a contact opening, in accordance with some embodiments.

In some embodiments, a rapid thermal anneal (RTA) process can be used to form titanium silicide ($TiSi_2$) at the bottom of contact opening 300. $TiSi_2$ is formed when metal 400 reacts with silicon in the top surface of S/D epitaxial layer 260 during the RTA process. In some embodiments, the RTA temperature can range from about 500° C. to about 600° C. The RTA process can last from about 30 s to about 200 s. According to some embodiments, heat lamps can be used in the RTA process. However, other annealing methods may be used; for example, a laser anneal may be used. In some embodiments, a single RTA operation can be sufficient to form $TiSi_2$. However, more than one RTA operations are possible. FIG. 5 shows contact opening 300 after an RTA process, where a silicide layer 500 is formed on S/D epitaxial layer 260. In some embodiments, the thickness of silicide layer 500 can range from about 5 nm to about 15 nm.

In areas where silicon is exposed, metal 400 can react with silicon to form a silicide. In other areas where no silicon is present (e.g., where silicon is covered with oxides, nitride layers, or metals), there is little or no silicide formation. Additional metals that may be used to form silicides with a stable, low-resistance phase (e.g., grain structure) include cobalt (Co), nickel (Ni), tungsten (W), tantalum (Ta), and molybdenum (Mo). The resulting silicides can include cobalt silicide ($CoSi_2$), nickel silicide (NiSi), tungsten silicide ($WSi_2$), tantalum silicide ($TaSi_2$), and molybdenum silicide ($MoSi_2$) respectively. The annealing conditions (e.g., annealing temperature, annealing time, and method of heating) can influence the silicide's thickness, composition, and phase (grain structure). Some silicides may require one or more annealing steps to achieve a low resistance phase.

Figure 6:
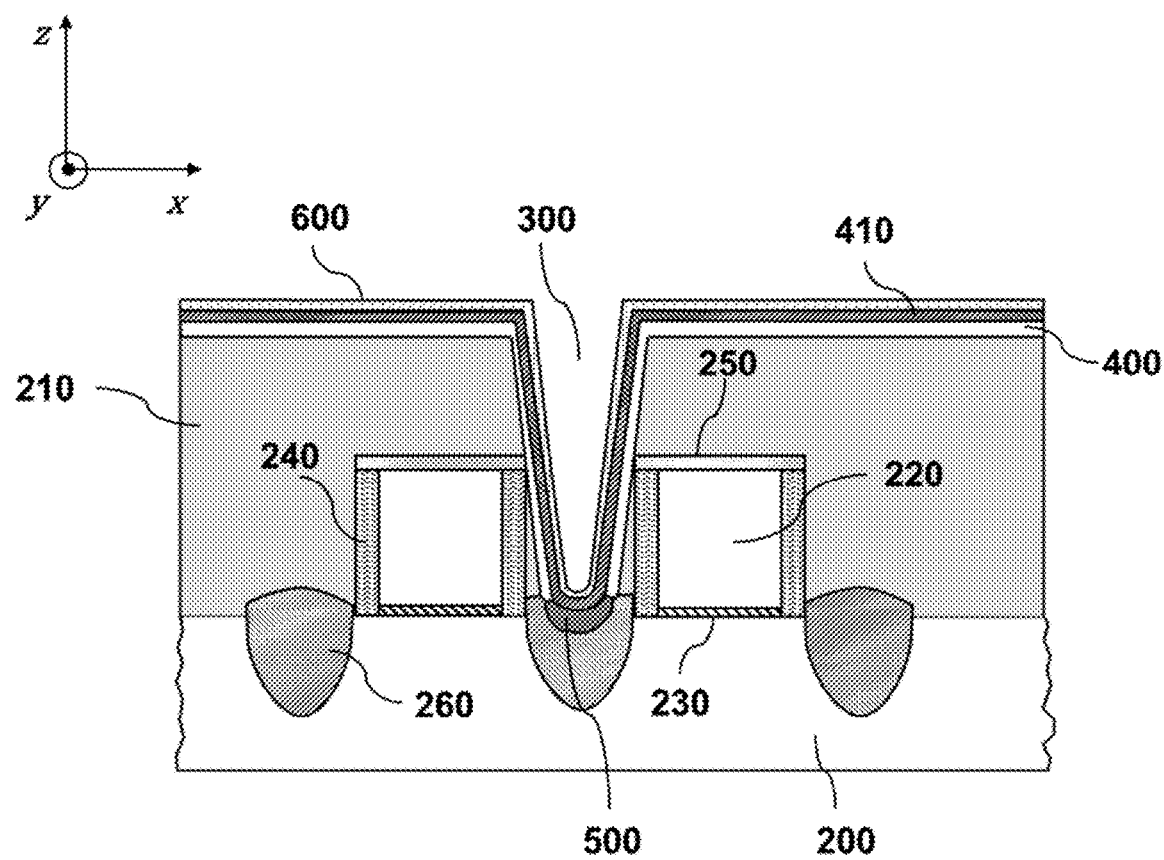
FIG. 6 is a cross sectional view of an example contact opening in a dielectric after deposition of a liner layer in a contact opening, in accordance with some embodiments.

Method 100 continues with operation 140 and the formation of a liner layer 600 on barrier layer 410 as shown in FIG. 6. In some embodiments, liner layer 600 is a Co layer with a thickness between about 70 Å to about 110 Å (e.g., 90 Å). By way of example and not limitation, liner layer 600 can be deposited with an RF PVD process at room temperature (e.g., about 24° C.). In some embodiments, the deposition pressure during the liner layer formation can be between about 50 mTorr and about 150 mTorr (e.g., 100 mTorr). According to some embodiments, the RF PVD process may utilize a high frequency RF generator that can operate between about 40 MHz to about 45 MHz and have an output power between about 500 Watts to 3000 Watts. Further, during the liner layer deposition, the RF power is applied to the Co target. In some embodiments, liner layer 600 covers barrier layer 410. Liner layer 600 does not fill contact opening 300 and its function is to provide a growth surface for a subsequent Co deposition, according to some embodiments.

Figure 7:
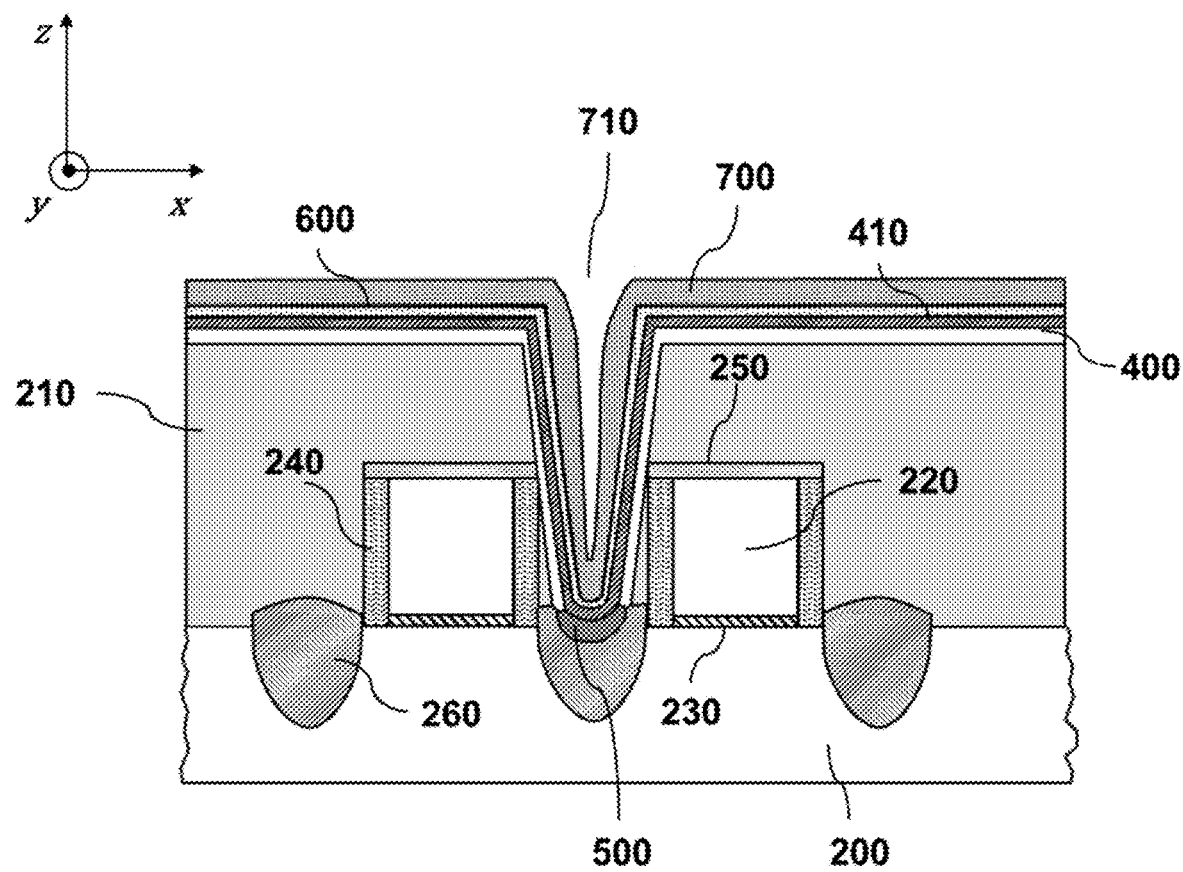
FIG. 7 is a cross sectional view of an example contact opening in a dielectric after partial deposition of a cobalt layer in a contact opening, in accordance with some embodiments.

Method 100 continues with operation 150 and the formation of a metal layer 700 deposited on liner layer 600 as shown in FIG. 7. Metal layer 700 partially fills contact opening 300 (shown in FIG. 6) and forms opening 710, which is smaller than contact opening 300. According to some embodiments, metal layer 700 is a Co layer that can be deposited with a CVD process at a deposition temperature between about 150° C. and about 200° C. and at a process pressure below 10 Torr—for example, between about 2 Torr and about 5 Torr. By way of example and not limitation, the thickness of the deposited Co layer can be about 180 Å. Co deposition via. CVD can be accomplished by using, for example, an organometallic precursor.

Figure 8:
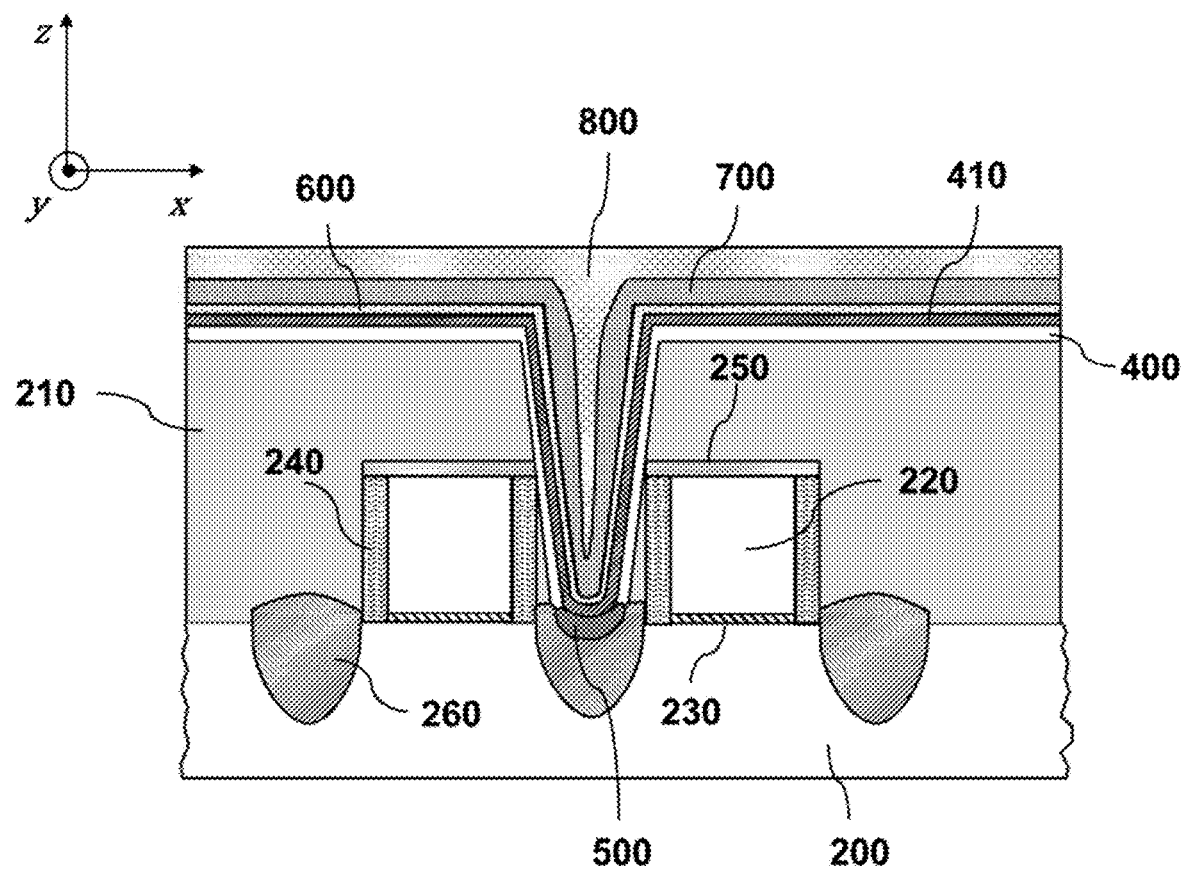
FIG. 8 is a cross sectional view of an example metal contact in a dielectric after deposition of a cobalt layer with a co-deposition/reflow process, in accordance with some embodiments.
Figure 9:
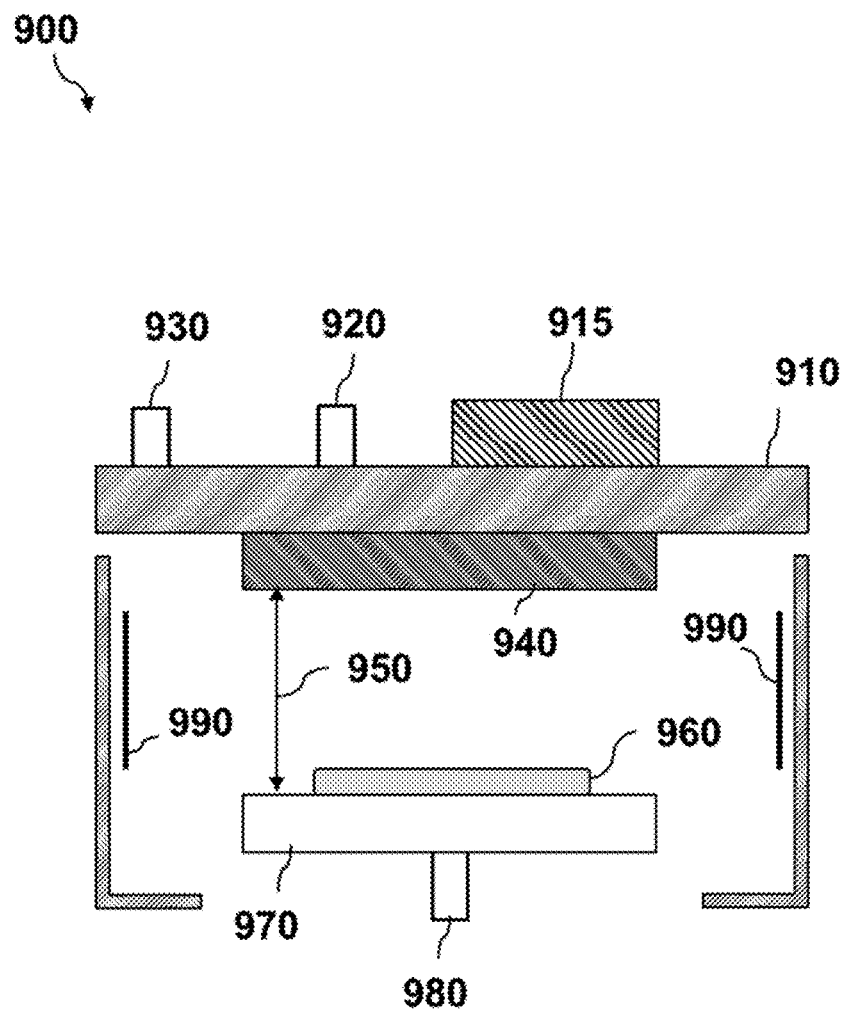
FIG. 9 is a cross sectional view of an example physical vapor deposition (PVD) reactor that can independently control a co-deposition/reflow process of a deposited metal, in accordance with some embodiments.

Method 100 continues with operation 160 and the formation of a metal layer 800 on metal layer 700 to fill opening 710 (of FIG. 7) as shown in FIG. 8. In some embodiments, metal layer 800 is deposited and reflowed concurrently (e.g., reflow and co-deposition). In some embodiments, the deposition and reflow of metal layer 800 can be performed in an exemplary PVD reactor 900, a cross section of which is depicted in FIG. 9. An external DC and RF power generators (not shown in FIG. 9) can be connected to PVD reactor 900 through respective feed-through connections 920 and 930 located on a top surface 910 of PVD reactor 900. A Co target 940 can be mounted on an inner surface of PVD reactor 900. In some embodiments, an Ar plasma can be used to sputter Co material from Co target 940. Co target 940 can be separated by a spacing 950 from an electrostatic chuck 970. During processing, a wafer 960 can be positioned on electrostatic chuck 970. Wafer 960 can be secured in place on electrostatic chuck 970 with an electrostatic force. Additionally, electrostatic chuck 970 includes a heater (not shown in FIG. 9) than can provide heat to wafer 960. Electrostatic chuck 970 includes a feed-through connection 980, which can be connected to another external RF generator (not shown in FIG. 9). This external RF generator can provide an RF power to wafer 960 through feed-through connection 980 and electrostatic chuck 970. A coil magnet 990, located on inner sidewall surfaces of PVD chamber 900, can be used to modulate the directionality of the ionic species in the plasma. Magnet 915, located on top surface 910, can confine argon ions ($Ar^+$) closer to target 940. In some embodiments, the spacing between magnet 915 and target 940 can range from about 0.8 mm to about 1.2 mm.

The locations of the aforementioned elements can be different depending on the design of exemplary PVD reactor 900, therefore the depiction of exemplary PVD reactor 900 in FIG. 9 should not be limiting. For illustration purposes, FIG. 9 includes select portions of exemplary PVD reactor 900 and other portions (not shown) may be included. For example, gas lines, gas exhaust lines, electrical connections, heaters, valves, additional panels, external peripherals and equipment may be included.

In some embodiments, the deposition of metal layer 800 can concurrently occur with a "reflow" process. During the deposition process, argon ions ($Ar^+$) from the plasma can sputter Co material from target 940. During the reflow process, $Ar^+$ impinge (bombard) the surface of wafer 960 so that the sputtered Co material can be "repositioned," or reflowed, through a re-sputtering process in opening 710 of FIG. 7. To assist with the reflow process, wafer 960 is heated via the heater in electrostatic chuck 970 to a temperature between about 300° C. and about 500° C. (e.g., 450° C.). According to some embodiments, the deposition and reflow process is balanced to achieve an optimal gap fill performance. For example, if the deposition rate is high and the reflow is weak, pinch-off at the entrance of opening 710 may occur and a void can be formed. Conversely, if the deposition rate is low and the reflow is strong, Co metal may not fill opening 710 by the end of the co-deposition/reflow process.

In some embodiments, the deposition and the reflow processes can be individually controlled via an independent top and bottom RE power. The independent top and bottom RF power can be applied respectively to target 940 and water 960 via corresponding feed-through connections 930 and 980. The top and bottom RF power can be provided by corresponding external RF generators as discussed above. By way of example and not limitation, an external RF generator, with a power output between about 500 Watts to about 3000 Watts, can provide the top RE power with a frequency between about 40 MHz to about 45 MHz. Another RF generator, with a power output between about 20 Watts to about 100 Watts, can provide the bottom RE power with a frequency between about 10 MHz to about 15 MHz. According to some embodiments, the bottom to top RE power ratio can range from about 4% to about 10% for an optimal metal gap fill window. Depending on the contact opening, the bottom to top RF power ratio may be adjusted outside the provided window (e.g., from about 4% to about 10%). Therefore, the RF power ratio provided is exemplary and not limiting.

The top RF power may not be sufficient to sputter material from target 940 and therefore, a DC power from an external DC power generator can be applied to target 940 through feed-through connection 920 to attract $Ar^+$ and increase the sputter rate of Co material from target 940. In some embodiments, the DC power can range from about 200 Watts to about 1000 Watts. In some embodiments, the deposition rate of the deposited Co metal depends on the DC to top RF power ratio, which can be greater than about 25% (e.g. about 65%). According to some embodiments, the top RF power can tune the Co deposition rate and improve deposition uniformity. In some embodiments, high DC to top RF power ratio can increase the deposition rate and cause pinch off. On the other hand, a low DC to top RF power ratio can weaken Co deposition and result in poor gap fill of opening 710. In other words, the DC to top RF power ratio can influence the balance between deposition and reflow.

According to some embodiments, spacing 950 can range between about 70 mm to about 130 mm (e.g., 95 mm to 105 mm). In some embodiments, spacing 950 can serve as another factor to control the deposition and uniformity of metal layer 800. Coil magnet 990, fitted on the inner sidewall surfaces of PVD reactor 900, can further assist with the metal deposition uniformity and influence the impingement angle of $Ar^+$ on the wafer's surface during the reflow process.

Figure 10:
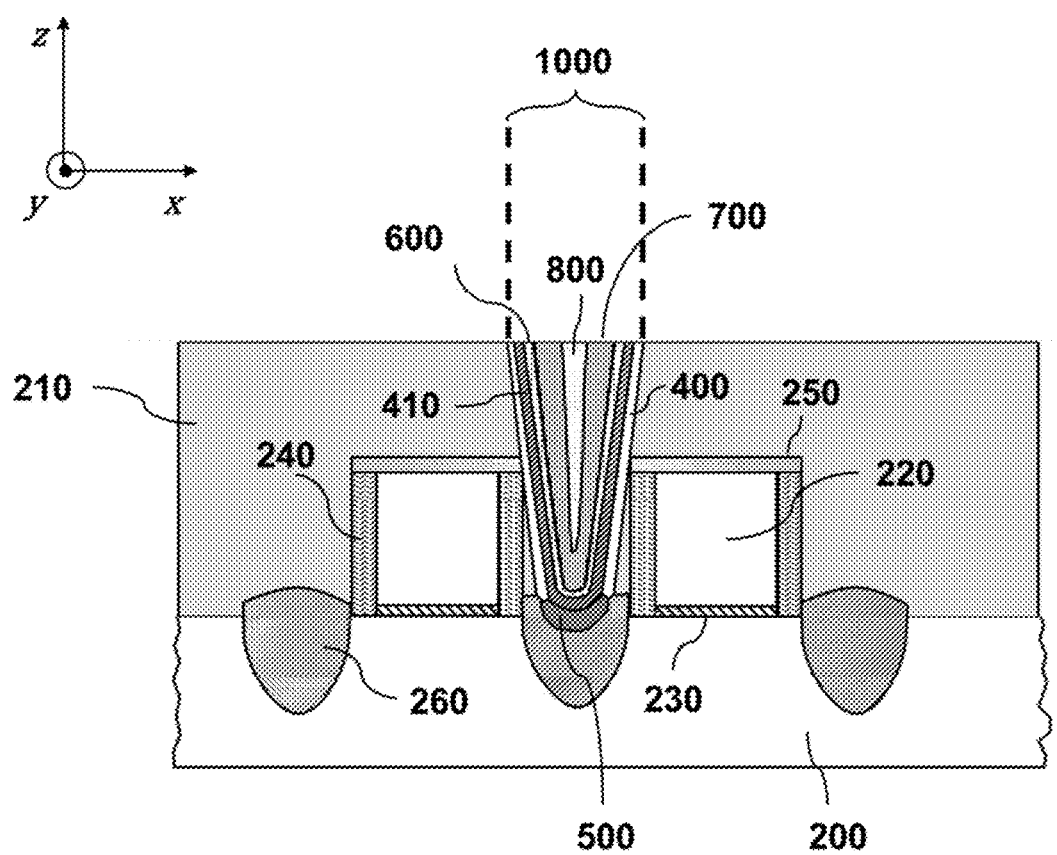
FIG. 10 is a cross sectional view of an example metal contact in a dielectric after a chemical mechanical planarization (CMP) process, in accordance with some embodiments.

Referring to operation 170 of method 100, a chemical mechanical planarization (CMP) process can be used to remove the metal layers deposited over dielectric 210 (e.g., 400, 410, 600, 700, and 800) as shown in FIG. 10 and to form metal contact 1000 over S/D epitaxial layer 260. CMP is a polishing process, which utilizes a chemical slurry in conjunction with a polishing pad to remove conductive or dielectric materials from a top surface of the wafer. CMP may achieve a planar and smooth topography across a wafer upon which additional layers of integrated circuitry can be built. The CMP process can be either end-pointed or timed, in an end-pointed CMP process, polishing can be automatically terminated when a polish rate difference is detected; for example, when a polish rate difference is detected between the layer that is being polished and an underlying layer. In some embodiments, the CMP process can use different slurry chemistries and polishing pads to remove the metal layers deposited over dielectric 210 (e.g., 400, 410, 600, 700, and 800).

In a similar manner as described above with respect to S/D epitaxial layer 260, metal contacts can be formed on metal gate electrodes, such as gate electrode 220. Further, a "shared" metal contact can be formed between a gate electrode and an epitaxial layer, where the shared metal contact "touches" both the gate electrode and the S/D epitaxial layer. Shared metal contacts are within the spirit and scope of this disclosure and can be fabricated using some or all of the operations of method 100 described above.

The embodiments described herein are directed to a metallization process with improved gap fill properties. According to some embodiments, the metallization process can fill contact holes with an AR between about 3 to about 10 and a height greater than about 60 nm. By way of example and not limitation, the metallization process includes a co-deposition/reflow PVD process. According to some embodiments, the deposition and reflow process can be individually controlled via an independent top RF power and bottom RF power provided to the target and the wafer respectively. The metal deposition rate can further be modulated by a DC power which can be applied to the target. As a result, the DC to top RF power ratio can also be independently controlled, according to some embodiments.

In some embodiments, a method includes forming a contact opening in an oxide, depositing a barrier layer in the contact opening, depositing a liner layer on the barrier layer, depositing a first metal layer on the liner layer to partially fill the contact opening. The method further includes, depositing a second metal layer on the first metal layer to fill the contact opening, where depositing the second metal layer includes sputter depositing the second metal layer using a first RF power and a DC power, and reflowing the second metal layer using a second RF power.

In some embodiments, a method includes providing a substrate with a source/drain epitaxial layer thereon, depositing a dielectric layer over the substrate, etching a contact opening in the dielectric layer to expose the source/drain epitaxial layer. The method further includes, depositing a barrier layer in the contact opening; depositing a liner layer on the barrier layer; depositing a first metal layer on the liner layer to partially fill the contact opening; and depositing a second metal layer on the first metal layer to fill the contact opening, where depositing the second metal layer includes concurrently sputtering and reflowing the second metal layer with a first RF power applied to a target and a second RF power applied to the substrate.

In some embodiments, a method includes providing a substrate with a FET thereon, depositing an oxide over the substrate, etching a first contact opening and a second contact opening in the oxide to expose a gate of the FET and a source/drain epitaxial layer of the FET respectively, depositing a barrier layer in the first and the second openings, depositing a liner layer over the barrier layer, depositing a first metal layer over the liner layer to partially fill the first and the second contact openings. The method further includes, depositing a second metal layer over the first metal layer to fill the first and the second contact openings, where depositing the second metal layer includes sputter depositing and reflowing the second metal layer with each of a first RF power and a DC power applied to a target and a second RF power applied to an electrostatic chuck in contact with the substrate.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a contact opening in an oxide disposed on a substrate;

depositing a barrier layer in the contact opening;
depositing a liner layer on the barrier layer;
depositing a first metal layer on the liner layer to partially fill the contact opening;
depositing a second metal layer on the first metal layer to fill the contact opening, wherein depositing the second metal layer comprises:
sputter depositing the second metal layer from a metal target by applying a first radio frequency (RF) power and a direct current (DC) power to bias the metal target while
reflowing the second metal layer by applying a second RF power to bias the substrate, wherein a magnitude of the second RF power is less than that of the first RF power and the DC power.

2. The method of claim 1, wherein depositing the second metal layer comprises a physical vapor deposition process (PVD) operating at a process temperature between about 300° C. and about 500° C.

3. The method of claim 1, wherein reflowing the second metal layer comprises impinging the second metal layer with argon ions.

4. The method of claim 1, wherein a magnitude ratio of the DC power to the first RF power is greater than about 65%.

5. The method of claim 1, wherein a magnitude ratio of the second RF power to the first RF power is between about 4% and about 10%.

6. The method of claim 1, wherein a magnitude of the first RF power is between about 500 Watts and about 3000 Watts, and the magnitude of the second RF power is between about 20 Watts and about 100 Watts.

7. The method of claim 1, wherein the first RF power has a frequency between about 40 MHz and about 45 MHz, and the second RF power has a frequency between about 10 MHz and about 15 MHz.

8. The method of claim 1, wherein each of the liner layer, the first metal layer, and the second metal layer comprises cobalt (Co).

9. A method, comprising:
providing a substrate with a source/drain epitaxial layer;
depositing a dielectric layer over the substrate;
etching a contact opening in the dielectric layer to expose the source/drain epitaxial layer;
depositing a barrier layer in the contact opening;
depositing a liner layer on the barrier layer;
depositing a first metal layer on the liner layer to partially fill the contact opening; and
depositing a second metal layer on the first metal layer to fill the contact opening, wherein depositing the second metal layer comprises concurrently sputtering and reflowing the second metal layer with a first radio frequency (RF) power comprising a first frequency applied to a target and a second RF power comprising a second frequency higher than the first frequency applied to the substrate.

10. The method of claim 9, wherein a magnitude ratio of the second RF power to the first RF power is between about 4% and about 10%.

11. The method of claim 9, wherein sputtering comprises applying a direct current (DC) power to the target, and wherein a magnitude ratio of the DC power to the first RF power is greater than about 25%.

12. The method of claim 9, wherein the contact opening has an aspect ratio greater than or equal to about 3 and less than about 10.

13. The method of claim 9, wherein the contact opening has a height greater than about 60 nm, a top portion with a critical dimension (CD) less than about 17 nm, and a bottom portion with a CD less than about 14 nm.

14. The method of claim 9, wherein depositing the second metal layer comprises a physical vapor deposition process (PVD) operating at a temperature between about 300° C. and about 500° C.

15. A method, comprising:
providing a substrate with a field effect transistor (FET);
depositing an oxide over the substrate;
etching a first contact opening and a second contact opening in the oxide to expose a gate of the FET and a source/drain epitaxial layer of the FET respectively;
depositing a barrier layer in the first and the second contact openings;
depositing a liner layer over the barrier layer;
depositing a first metal layer over the liner layer to partially fill the first and the second contact openings; and
depositing a second metal layer over the first metal layer to fill the first and the second contact openings, wherein depositing the second metal layer comprises sputter depositing and reflowing the second metal layer with each of a first radio frequency (RF) power and a direct current (DC) power applied to a target and a second RF power applied to an electrostatic chuck in contact with the substrate, and wherein a magnitude of the first RF power is different from that of the second RF power and the DC power.

16. The method of claim 15, wherein a magnitude ratio of the DC power to the first RF power ratio is greater than 65%.

17. The method of claim 15, wherein a magnitude of the DC power ranges from about 200 Watts to about 1000 Watts, the magnitude of the first RF power ranges from about 500 Watts to about 3000 Watts, and a magnitude of the second RF power ranges from about 20 Watts to about 100 Watts.

18. The method of claim 15, wherein each of the liner layer, the first metal layer, and the second metal layers comprises cobalt (Co).

19. The method of claim 15, wherein a spacing between the target and the electrostatic chuck is between about 95 mm to about 105 mm.

20. The method of claim 15, wherein reflowing the second metal layer comprises sputtering the second metal layer with argon ions to reposition the second metal layer in the first and the second contact openings.

* * * * *

UNITED STATES PATENT AND TRADEMARK OFFICE
CERTIFICATE OF CORRECTION

PATENT NO. : 10,964,590 B2
APPLICATION NO. : 15/967056
DATED : March 30, 2021
INVENTOR(S) : Chou et al.

Page 1 of 1

It is certified that error appears in the above-identified patent and that said Letters Patent is hereby corrected as shown below:

In the Specification

In Column 6, Line 31, delete "trifluotide" and insert --trifluoride--, therefor.

In Column 6, Line 33, delete "StD" and insert --S/D--, therefor.

In Column 8, Line 52, delete "RE" and insert --RF--, therefor.

In Column 8, Line 54, delete "water" and insert --wafer--, therefor.

In Column 8, Line 59, delete "RE" and insert --RF--, therefor.

In Column 8, Line 62, delete "RE" and insert --RF--, therefor.

In Column 8, Line 64, delete "RE" and insert --RF--, therefor.

In Column 9, Line 40, delete "timed," and insert --timed.--, therefor.

In Column 9, Line 41, delete "in" and insert --In--, therefor.

In the Claims

In Column 11, Claim 1, Line 4, delete "opening;" and insert --opening; and--, therefor.

Signed and Sealed this
First Day of June, 2021

Drew Hirshfeld
*Performing the Functions and Duties of the
Under Secretary of Commerce for Intellectual Property and
Director of the United States Patent and Trademark Office*